United States Patent
Shufflebotham et al.

(10) Patent No.: US 6,184,158 B1
(45) Date of Patent: *Feb. 6, 2001

(54) INDUCTIVELY COUPLED PLASMA CVD

(75) Inventors: Paul Kevin Shufflebotham, San Jose; Brian McMillin, Fremont; Alex Demos, San Francisco; Huong Nguyen, Danville; Butch Berney, Pleasanton; Monique Ben-Dor, Palo Alto, all of CA (US)

(73) Assignee: Lam Research Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/772,374

(22) Filed: Dec. 23, 1996

(51) Int. Cl.$^7$ ..................................... H01J 37/32
(52) U.S. Cl. .................. 438/788; 438/624; 438/631; 438/695; 438/784; 438/786; 438/778; 438/788; 438/789; 438/902; 438/906; 427/573; 427/579; 204/192.23
(58) Field of Search ................................. 438/695, 788, 438/789, 631, 786, 778, 902, 784, 906, 624; 427/573, 579; 204/192.23

(56) References Cited

U.S. PATENT DOCUMENTS

| | | |
|---|---|---|
| 4,173,661 | 11/1979 | Bourdon . |
| 4,270,999 | 6/1981 | Hassan et al. . |
| 4,512,283 | 4/1985 | Bonifield et al. . |
| 4,539,068 * | 9/1985 | Takagi et al. .................. 156/614 |
| 4,579,618 | 4/1986 | Celestino et al. . |
| 4,614,639 | 9/1986 | Hegedus . |
| 4,690,746 * | 9/1987 | McInerney et al. ............ 204/192.23 |
| 4,691,662 | 9/1987 | Roppel et al. . |
| 4,732,761 * | 3/1988 | Machida et al. ..................... 437/228 |
| 4,806,321 | 2/1989 | Nishizawa et al. . |
| 4,854,263 | 8/1989 | Chang et al. . |
| 4,877,641 | 10/1989 | Dory . |
| 4,913,929 | 4/1990 | Moslehi et al. . |
| 4,919,745 | 4/1990 | Fukuta et al. . |
| 4,943,345 | 7/1990 | Asmussen et al. . |
| 4,948,458 | 8/1990 | Ogle . |
| 4,980,204 | 12/1990 | Fujii et al. . |
| 4,992,301 | 2/1991 | Shishiguchi et al. . |

(List continued on next page.)

FOREIGN PATENT DOCUMENTS

| | | |
|---|---|---|
| 0 440 154 | 8/1991 | (EP) . |
| 0 489 407 | 6/1992 | (EP) . |
| 0520519 | 12/1992 | (EP) . |
| 0637058 | 2/1995 | (EP) . |
| 0641013A2 | 3/1995 | (EP) . |
| 0674336 | 9/1995 | (EP) . |
| 0 676 793 | 10/1995 | (EP) . |
| 0676790 | 10/1995 | (EP) . |
| 0709875 | 5/1996 | (EP) . |
| WO96/25023 | 8/1996 | (WO) . |

OTHER PUBLICATIONS

Database WPI; Section Ch., Week 9603, Derwent Publications Ltd., London, GB,; An 96–025387, XP00206075 and JP 07 297 139 A (Sony Corp), Nov. 10, 1995.

(List continued on next page.)

*Primary Examiner*—Charles Bowers
*Assistant Examiner*—Lisa Kilday
(74) *Attorney, Agent, or Firm*—Burns, Doane, Swecker & Mathis, L.L.P.

(57) ABSTRACT

A method of depositing a dielectric film on a substrate in a process chamber of an inductively coupled plasma-enhanced chemical vapor deposition reactor. Gap filling between electrically conductive lines on a semiconductor substrate and depositing a cap layer are achieved. Films having significantly improved physical characteristics including reduced film stress are produced by heating the substrate holder on which the substrate is positioned in the process chamber.

60 Claims, 4 Drawing Sheets

U.S. PATENT DOCUMENTS

| | | | | |
|---|---|---|---|---|
| 4,996,077 | | 2/1991 | Moslehi et al. . | |
| 5,013,691 | * | 5/1991 | Lory et al. | 437/238 |
| 5,089,442 | * | 2/1992 | Olmer | 432/235 |
| 5,105,761 | | 4/1992 | Charlet et al. . | |
| 5,124,014 | * | 6/1992 | Foo et al. | 204/192.34 |
| 5,134,965 | | 8/1992 | Tokuda et al. . | |
| 5,164,040 | | 11/1992 | Eres et al. . | |
| 5,169,509 | | 12/1992 | Latz et al. . | |
| 5,182,221 | * | 1/1993 | Sato | 437/67 |
| 5,192,370 | | 3/1993 | Oda et al. . | |
| 5,231,334 | | 7/1993 | Paranjpe . | |
| 5,252,133 | | 10/1993 | Miyazaki et al. . | |
| 5,262,029 | | 11/1993 | Erskine et al. . | |
| 5,267,607 | | 12/1993 | Wada . | |
| 5,279,865 | | 1/1994 | Chebi et al. . | |
| 5,280,154 | | 1/1994 | Cuomo et al. . | |
| 5,286,518 | * | 2/1994 | Cain et al. | 427/96 |
| 5,346,578 | | 9/1994 | Benzing et al. . | |
| 5,368,710 | | 11/1994 | Chen et al. . | |
| 5,384,008 | | 1/1995 | Sinha et al. . | |
| 5,399,387 | | 3/1995 | Law et al. . | |
| 5,401,350 | | 3/1995 | Patrick et al. . | |
| 5,405,480 | | 4/1995 | Benzing et al. . | |
| 5,415,728 | | 5/1995 | Hasegawa et al. . | |
| 5,498,313 | | 3/1996 | Bailey et al. . | |
| 5,522,934 | | 6/1996 | Suzuki et al. . | |
| 5,522,936 | | 6/1996 | Tamura . | |
| 5,525,159 | | 6/1996 | Hama et al. . | |
| 5,529,657 | | 6/1996 | Ishii . | |
| 5,531,834 | | 7/1996 | Ishizuka et al. . | |
| 5,552,124 | | 9/1996 | Su . | |
| 5,556,521 | | 9/1996 | Ghanbari . | |
| 5,571,571 | * | 11/1996 | Musaka et al. | 427/574 |
| 5,605,599 | * | 2/1997 | Benzing et al. | 156/643.1 |
| 5,614,055 | | 3/1997 | Fairbairn et al. . | |
| 5,616,519 | * | 4/1997 | Ping | 438/626 |
| 5,628,829 | * | 5/1997 | Foster et al. | 118/723 E |
| 5,643,640 | * | 7/1997 | Chakravarti et al. | 427/578 |
| 5,653,806 | | 8/1997 | Van Buskirk . | |
| 5,679,606 | * | 10/1997 | Wang et al. | 437/195 |
| 5,686,356 | * | 11/1997 | Jain et al. | 437/195 |
| 5,723,386 | * | 3/1998 | Ishikawa | 437/787 |
| 5,744,400 | * | 4/1998 | Dyer | 156/345 B |
| 5,753,564 | * | 5/1998 | Fukada | 437/238 |
| 5,776,834 | * | 7/1998 | Avanzino et al. | 438/692 |
| 5,783,492 | * | 7/1998 | Higuchi et al. | 438/710 |
| 5,789,314 | * | 8/1998 | Yen et al. | 438/622 |
| 5,858,876 | * | 1/1999 | Chew | 438/695 |
| 5,916,820 | * | 6/1999 | Okumura | 438/694 |

OTHER PUBLICATIONS

Spindler O., et al., In Situ Planarization of Intermetal Dielectrics: Process Steps. Degree of Planarization and Film Properties, Thin Solid Films, 175, No. 1, Aug. 1989, pp. 67–72.

"Fundamentals, Etching, Deposition, and Surface Interactions", by Stephen M. Rossnagel et al., *Handbook of Plasma Processing Technology*, (1989), pp. 233–306.

"Electron cyclotron resonance microwave discharges for etching and thin–film deposition", by Jes Asmussen, *J. Vac. Sci. Technol. A.*, vol. 7, No. 3, (May/Jun. 1989), pp. 883–893.

"Silicon dioxide trench filling process in a radio–frequency hollow cathode reactor", by M. Gross et al., *J. Vac. Sci. Technol. B.*, vol. 11(2), (Mar./Apr. 1993), pp. 242–248.

"Low–temperature deposition of silicon dioxide films from electron cyclotron resonant microwave plasmas", by T.V. Herak et al., *J. Appl. Phys.*, 65(6), (Mar. 15, 1989), pp. 2457–2463.

"New approach to low temperature deposition of high–quality thin films by electron cyclotron resonance microwave plasmas", by T.T. Chau et al., *J. Vac. Sci. Technol. B.*, vol. 10(5), (Sep./Oct. 1992), pp. 2170–2178.

Shufflebotham, P. et al., "Biased Electron Cyclotron Resonance Chemical–Vapor Deposition of Silicon Dioxide Inter––Metal Dielectric Thin Films" *Materials Science Forum*, vol. 140–142 (1993) pp. 255–268, Trans Tech Publications, Switzerland.

Webb, D.A., et al., "Silicon Dioxide Films Produced by PECVD of TEOS and TMCTS", *10439 Proceedings of the Int. Symp. on Ultra Large Scale Integration Science and Technology*, (1989) No. 9, Pennington, NJ.

Fukada, T. et al., "Preparation of SiOF Films with Low Dielectric Constant by ECR Plasma CVD" *CUMIC Conference*, Feb. 21–22, 1995, 1995 ISMIC—101D/95/0043, pp. 43–46.

Qian, L.Q., et al., "High Density Plasma Deposition and Deep Submicron Gap Fill with Low Dielectric Constant SiOF Films" *CUMIC Conference*, Feb. 21–22, 1995, 1995, ISMIC—101D/95/0050, pp. 50–56.

Schuchmann, D.C, et al., "Comparison of PECVD F–TEOS Films and High Density Plasma SiOF Films" *VMIC Conference*, Jun. 27–29, 1995, 1995 ISMIC–104/95/0097, pp. 97–103.

Hewes, K. et al., "An Evaluation of Fluorine Doped Peteos on Gap Fill Ability and Film Characterization" Texas Instruments, Dallas Texas (undated).

Shapiro, M.J., et al., "Dual Frequency Plasma CVD Fluorosilicate Glass Water Absorption and Stability" *DUMIC Conference*, Feb. 21–22, 1995; 1995 ISMIC–101D/95/118, pp. 118–123.

Miyajima, H. et al., "Water–absorption mechanisms of F–doped PECVD $SiO_2$ with low–dielectric constant" *VMIC Conference*, Jun. 27–29, 1995; 1995 ISMIC–104/95/391, pp. 391–393.

Yeh, C.F., "Controlling Fluorine Concentration and Thermal Annealing Effect on Liquid–Phase Deposited $SiO_{2-x}F_x$Films" *J. of Electrochem. Soc.*, vol. 142, No. 10, Oct. 1995, pp. 3579–3583.

Kuo, Y., "Reactive ion etching technology in thin–film–transitor processing" *IBM J. Res. Develop.*, vol. 36, No. 1, Jan. 1992, pp. 69–75.

Fukada, T. et al., Preparation of SiOF Films with Low Dielectric Constant by ECR Plasma Chemical Vapor Deposition, *Extended Abst. of the 1993 Intern. Conf. on Solid State Devices and Materials*, Makuhari, 158–160, 1993.

* cited by examiner

INDUCTIVELY COUPLED PLASMA CVD

FIELD OF THE INVENTION

The present invention relates to a method and apparatus for high-density plasma-enhanced chemical vapor deposition of semiconducting and dielectric films and more particularly to techniques for depositing such films into high aspect ratio gaps on semiconductor substrates such as silicon wafers having metal interconnection layers.

DESCRIPTION OF THE RELATED ART

Chemical vapor deposition (CVD) is conventionally used to form various thin films in a semiconductor integrated circuit. CVD can form thin films such as $SiO_2$, $Si_3N_4$, Si or the like with high purity and high quality. In the reaction process of forming a thin film, a reaction vessel in which semiconductor substrates are arranged can be heated to a high temperature condition of 500 to 1000° C. Raw material to be deposited can be supplied through the vessel in the form of gaseous constituents so that gaseous molecules are thermally dissociated and combined in the gas and on a surface of the substrates so as to form a thin film.

A plasma-enhanced CVD apparatus utilizes a plasma reaction to create a reaction similar to that of the above-described CVD apparatus, but at a relatively low temperature in order to form a thin film. The plasma CVD apparatus includes a process chamber consisting of a plasma generating chamber which may be separate from or part of a reaction chamber, a gas introduction system, and an exhaust system. Plasma is generated in such apparatus by various plasma sources. A substrate support is provided in the reaction chamber which may include a radio frequency (RF) biasing component to apply an RF bias to the substrate and a cooling mechanism in order to prevent a rise in temperature of the substrate due to the plasma action.

Vacuum processing chambers are generally used for chemical vapor depositing of materials on substrates by supplying deposition gas to the vacuum chamber and applying of an RF field to the gas. For example, parallel plate and electron-cyclotron resonance (ECR) reactors have been commercially employed. See U.S. Pat. Nos. 4,340,462 and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in U.S. Pat. No. 5,262,029 and U.S. application Ser. No. 08/401,524 filed on Mar. 10, 1995.

Plasma-enhanced chemical vapor deposition (PECVD) has been used for depositing intermetal dielectric layers at low temperatures in integrated circuit applications. A publication by M. Gross et al. entitled "Silicon dioxide trench filling process in a radio-frequency hollow cathode reactor", J. Vac. Sci. Technol. B 11(2), March/April 1993, describes a process for void-free silicon dioxide filling of trenches using a hollow cathode reactor wherein silane gas is fed through a top target which supports a low frequency (1 MHz), low pressure (~0.2 Pa) oxygen and xenon discharge. In this process, high ion bombardment and a low rate of gas phase reaction produce an ion induced reaction with surface adsorbates, leading to directional oxide film growth whereby trenches with one micron openings and aspect ratios up to 2.5:1 are filled at rates over 400 Å/min.

A publication by P. Shufflebotham et al. entitled "Biased Electron Cyclotron Resonance Chemical-Vapor Deposition of Silicon Dioxide Inter-Metal Dielectric Thin Films," Materials Science Forum Vol. 140–142 (1993) describes a low-temperature single step gap-filled process for use in intermetal dielectric (IMD) applications on wafers up to 200 mm in diameter wherein sub −0.5 micron high aspect ratio gaps are filled with $SiO_2$ utilizing an $O_2$—Ar—$SiH_4$ gas mixture in a biased electron cyclotron resonance plasma-enhances chemical-vapor deposition (ECR-CVD) system. That single step process replaced sequential gap-filling and planarization steps wherein CVD $SiO_2$ was subjected to plasma etch-back steps, such technique being unsuitable for gap widths below 0.5 microns and aspect ratios (gap height:width) above 1.5:1.

Prior art apparatuses suffer from several serious disadvantages with respect to IMD applications. ECR and helicon sources which rely on magnetic fields are complex and expensive. Moreover, magnetic fields have been implicated to cause damage to semiconductor devices on the wafer. ECR, helicon and helical resonator sources also generate plasmas remotely from the wafer, making it very difficult to produce uniform and high quality films at the same time and also difficult to perform in-situ plasma cleans necessary to keep particulates under control without additional equipment. Furthermore, ECR, helicon and helical resonator, and domed inductively-coupled plasma systems require large, complex dielectric vacuum vessels. As a corollary scale-up is difficult and in-situ plasma cleaning is time consuming.

SUMMARY OF THE INVENTION

The present invention is directed to processes that employ an inductively coupled plasma-enhanced chemical vapor deposition (IC PECVD) high density plasma system. The system is compact, in-situ cleanable and produces high quality semiconductor and dielectric films.

In one aspect, the invention is directed to a method for filling gaps between electrically conductive lines on a semiconductor substrate comprising the steps of: providing a substrate in a process chamber of an inductively coupled plasma-enhanced chemical vapor deposition reactor which can include a substantially planar induction coil; introducing a process gas which can include a noble gas into the process chamber wherein the amount of noble gas is sufficient to assist in gap filling; and growing a dielectric film on the substrate with dielectric film being deposited in gaps between electrically conductive lines on the substrate.

In another aspect, the invention is directed to a method for filling gaps between electrically conductive lines on a semiconductor substrate comprising the steps of: providing a substrate in a process chamber of an inductively coupled plasma-enhanced chemical vapor deposition reactor which can include a substantially planar induction coil; filling gaps between electrically conductive lines on the substrate by: (i) introducing a first process gas which can include a noble gas into the process chamber wherein the amount of noble gas is sufficient to assist in gap filling; and (ii) growing a first dielectric film in the gaps at a first deposition rate; and depositing a capping layer comprising a second dielectric film onto the surface of said first dielectric film by introducing a second process gas into the process chamber, said capping layer being deposited at a second deposition rate that is higher than the first deposition rate.

In a further aspect, the invention is directed to a method of depositing a dielectric film on a substrate comprising the steps of: providing a substrate in a process chamber of an inductively coupled plasma-enhanced chemical vapor deposition reactor wherein the substrate is positioned on a substrate holder; introducing a process gas which can include a noble gas into the process chamber, wherein the amount of noble gas is sufficient to assist in depositing the dielectric film; controlling the temperature on a surface of the substrate holder; and energizing the process gas into a plasma state by inductively coupling RF energy into the process chamber and growing a dielectric film on the substrate.

In yet another aspect, the invention is directed to an inductively coupled plasma processing system comprising: a plasma processing chamber, a substrate holder supporting a substrate within said processing chamber wherein the substrate holder is at a temperature of about 80° C. to 200° C., an electrically-conductive coil that is disposed outside said processing chamber; means for introducing a process gas into said processing chamber; and an RF energy source which inductively couples RF energy into the processing chamber to energize the process gas into a plasma state. Planar and non-planar coils can be employed however, a substantially planar coil is preferred.

Depending on the film to be deposited, the process gas may comprise a silicon-containing reactant gas selected from the group consisting of $SiH_4$, $SiF_4$, $Si_2H_6$, TEOS, TMCTS, and mixtures thereof. The process gas may comprise a reactant gas selected from the group consisting of $H_2$, $O_2$, $N_2$, $NH_3$, $NF_3$, $N_2O$, and NO, and mixtures thereof. Alternatively, the process gas may comprises a reactant gas selected from the group consisting of boron-containing gas, phosphorous-containing gas, and mixtures thereof. Most preferably, the process gas may also include a noble gas such as argon.

According to one feature of the invention, the inductively coupled plasma is generated by an RF antenna having a planar coil design. Thus, the IC PECVD reactor can be easily scaled up to accommodate, for example, 300 mm wafers and 600 mm×720 mm flat panel displays. The inductively coupled plasma (ICP) source generates uniform, high density plasmas over large areas independently of the bias power used to control the ion sputter energy. Unlike ECR or helicon sources, no magnets are required.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

Inductively Coupled Plasma-Enhanced CVD Reactor

Figure 1:
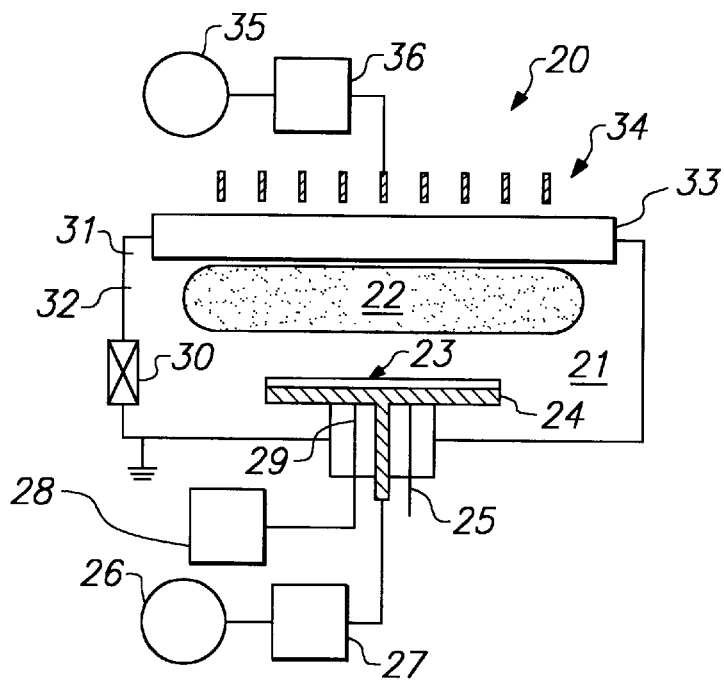
FIG. 1 is a schematic of a high density inductively coupled plasma reactor which can be used to carry out the process according to the invention.

FIG. 1 shows a ICP reactor 20 which can process substrates with high density plasma. Suitable ICP reactors include TCP™ systems from LAM Research Corp., Fremont, Calif. See also Ogle, U.S. Pat. No. 4,948,458 which is incorporated herein. The reactor includes a process chamber 21 in which plasma 22 is generated adjacent substrate 23. The substrate is supported on water cooled substrate support 24 and temperature control of the substrate is achieved by supplying helium gas through conduit 25 to a space between the substrate and the substrate support. The substrate support can comprise an anodized aluminum electrode, which may be heated, or a ceramic material having a buried electrode therein, the electrode being powered by an RF source 26 and associated circuitry 27 for providing RF matching, etc. The temperature of the substrate during processing thereof is monitored by temperature monitoring equipment 28 attached to temperature probe 29.

In order to provide a vacuum in chamber 21, a turbo pump is connected to outlet port 30 and a pressure control valve can be used to maintain the desired vacuum pressure. Process gases can be supplied into the chamber by conduits 31, 32 which feed the reactant gases to gas distribution rings extending around the underside of dielectric window 33 or the process gases can be supplied through a dielectric showerhead window. An external ICP coil 34 located outside the chamber in the vicinity of the window is supplied with RF power by RF source 35 and associated circuitry 36 for impedance matching, etc. As is apparent, the external induction coil is substantially planar and generally comprises a single conductive element formed into a planar spiral or a series of concentric rings. The planar configuration allows the coil to be readily scaled-up by employing a longer conductive element to increase the coil diameter and therefore accommodate larger substrates or multiple coil arrangements could be used to generate a uniform plasma over a wide area. When a substrate is processed in the chamber, the RF source 35 supplies the coil 34 with RF current preferably at a range of about 100 kHz–27 MHz, and more preferably at 13.56 MHz and the RF source 26 supplies the lower electrode with RF current preferably at a range of about 100 kHz–27 MHz, and more preferably at 400 kHz, 4 MHz or 13.56 MHz. A large DC sheath voltage above the surface of a substrate can be provided by supplying RF power to the electrode.

RF bias is applied to the substrate to generate ion bombardment of the growing film during the gap filling step. The RF frequency can be anything above the value necessary to sustain a steady state sheath, which is a few hundred kHz. Substrate bias has numerous beneficial effects on film properties, and can also be used to simultaneously sputter the growing film in the gap-fill step. This allows narrow, high aspect ratio gaps to be rapidly filled with high quality dielectric. RF bias can be used during the cap layer deposition step.

Reactor 20 can be used to carry out the gap filling process of the invention wherein a heavy noble gas is used to increase the etch-to-deposition rate ratio (EDR) for void-free filling of sub 0.5 μm high aspect ratio gaps. Gap filling processes are further described in copending application Ser. No. 08/623,825 filed on Mar. 29, 1996 entitled "IMPROVED METHOD OF HIGH DENSITY PLASMA CVD GAP-FILLING," which application is incorporated herein. The heavy noble gas is effective in sputtering corners of sidewalls of the gaps such that the corners are facetted at an angle of about 45 degrees. The noble gas has a low ionization potential and forms massive ions which enhance the sputtering rate at a given RF power relative to the deposition rate, thus reducing the power required to fill a given gap structure. Moreover, the low ionization potential of the noble gas helps spread plasma generation and ion bombardment more uniformly across the substrate. As xenon is the heaviest of the non-reactive noble gasses, xenon is preferred as the noble gas. Krypton can also be used even though it has a lower mass and higher ionization potential than xenon. Argon is also suitable as the noble gas. Preferably, the amount of noble gas added is effective to provide a sputter etch component with a magnitude on the order of the deposition rate such that the etch to deposition rate ratio is preferably about 5% to 70%, and more preferably about 10% to 40%.

In carrying out the deposition process in a ICP-CVD reactor, the chamber can be maintained at a vacuum pressure of less than 100 mTorr and preferably 30 mTorr or less and more preferably from about 1 mTorr to 5 mTorr. The flow rates of the individual components of the process gas typically ranges from 10 to 200 sccm for a 200 mm substrate and higher for larger substrates. A turbomolecular pump throttled by a gate valve is used to control the process pressure. The relative amount of each component will depend, in part, on the stoichiometry of the compound(s) to be deposited. The ICP power preferably ranges from 200 to 3000 watts, and the RF bias power applied to the bottom electrode can range from 0 to 3000 watts for a 200 mm substrate. Preferably the bottom electrode has a surface area so that the RF bias power can supply about 0–8 watts/cm$^2$ and preferably at least 2 watts/cm$^2$ of power. A heat transfer gas comprising, for example, helium and/or argon can be supplied at a pressure of 1 to 10 Torr to preferably maintain the substrate temperature at about −20° C. to 500° C., and more preferably at about 100° C. to 400° C. and most preferably about 150° C. to 375° C.

In order to prevent damage to metal lines or the pre-existing films and structures on the substrate and to ensure accurate and precise process control, a heated mechanical or preferably an electrostatic chuck (ESC) is employed to hold the substrate. The ESC is preferably bipolar or monopolar. Preferably, the electrode is maintained at a temperature ranging from about 50° C. to 350° C., in order to maintain the temperature of the wafer to about 325° C. to 375° C. The preferred electrode temperature will depend on, among other things, the RF bias level and the particular deposition step. For example, during the gap-fill process, the electrode temperature is preferably maintained between about 80° C. (full bias) to 200° C. (no bias). Similarly, during the capping process, the electrode temperature is preferably maintained at between about 125° C. (full bias) to 350° C. (no bias). The gap-fulling and capping processes are described herein. A suitable chuck for temperature control is disclosed in copending application Ser. No. 08/724,005, filed on Sep. 30, 1996, entitled "VARIABLE HIGH TEMPERATURE CHUCK FOR HIGH DENSITY PLASMA CHEMICAL VAPOR DEPOSITION", by Brian McMillin, which is incorporated herein, now U.S. Pat. No. 5,835,334.

During deposition the substrate (e.g., wafer) is typically maintained at a temperature that is higher than that of the ESC due to the plasma heating. Consequently, even though the ESC may be heated, its temperature is lower than that of the substrate. The electrode preferably also provides for helium backside cooling for substrate temperature control. The substrate temperature may be controlled by regulating the level of the RF bias and the ESC temperature and other parameters as described herein. As further described in the experiments herein, the electrode temperature can significantly influence the physical properties of the film deposited.

ICP-CVD reactor is particularly suited for depositing SiO$_2$ for IMD applications as the films produced are of excellent quality that are practically indistinguishable from SiO$_2$ grown by high temperature thermal oxidation of crystalline Si (thermal oxide). In addition, the technique can fill gaps as narrow as 0.25 μm at aspect ratios of 3:1 and higher with high quality material. Furthermore, deposition temperatures can be below 450° C. for compatibility with Al metallizations and thickness uniformities are better than 2% 1-σ on 8 in. (20.32 cm) wafers, with substantially no variations in other film properties. Finally, in terms of process manufacturability, ICP-CVD can achieve net deposition rates above 5,000 Å/min in the gap fill process. For the cap layer, ICP-CVD can provide a deposition rate up to about 1.51 km/min with good uniformity. It is understood that conductor lines can be made from other suitable materials, including, for example, copper, tungsten, and mixture thereof.

The deposition of SiO$_2$ into sub–0.5 micron high aspect ratio gaps by the inventive process involves the simultaneous deposition and sputtering of SiO$_2$. The resultant anisotropic deposition fills gaps from the bottom-up and the angular dependence of the sputtering yield also prevents the tops of the gaps from pinching off during deposition. An important feature of most high density plasma systems is that the bias power determines the sheath voltage above the wafer essentially independently of plasma generation. High bias powers generate large sheath voltages, and thus energetic ion bombardment of the wafer surface. In the absence of an RF bias, the film quality and gap-filling performance tend to be poor due to a jagged appearance of the sidewall film suggesting that it is very porous and heavy deposits forming above metal lines shadow the trench bottoms from deposition and eventually pinch-off the gap, leaving a void.

ICP can generate a high density plasma (e.g., >about $1\times10^{11}$ ions/cm$^3$) and sustain it even at a very low pressure (e.g., <about 10 mTorr). The advantages of high density PECVD include increased throughput, uniform ion and radical densities over large areas, and subsequent manufacturability of scaled-up reactors. When complemented with a separate RF biasing of the substrate electrode, ICP-CVD systems also allow independent control of ion bombardment energy and provide an additional degree of freedom to manipulate the plasma deposition process.

In ICP systems, SiO$_2$ film growth occurs by an ion-activated reaction between oxygen species impinging onto the wafer from the plasma source and silane fragments adsorbed on the wafer. Using ICP-CVD, sub–0.5 μm, high aspect ratio gaps can be filled with high quality SiO$_2$ dielectric on 8 in. (20.32 cm) diameter wafers. In essence, the ICP-CVD system provides a manufacturable intermetal dielectric CVD process that utilizes high density plasmas.

Process Gas Distribution System

It has been demonstrated that for high density PECVD, improved deposition rate and uniformity can be achieved by employing a gas distribution system which provides uniform, high flow rate delivery of reactant gases onto the substrate surface, to both increase the deposition rate and to minimize the chamber cleaning requirements. A suitable gas distribution system is disclosed in copending application Ser. No. 08/672,315, filed on Jun. 28, 1996, entitled "FOCUSED AND THERMALLY CONTROLLED PLASMA PROCESSING SYSTEM AND METHOD FOR HIGH DENSITY PLASMA CHEMICAL VAPOR DEPOSITION OF DIELECTRIC FILMS," by Brian McMillin et al., which application is incorporated herein.

Figure 4:
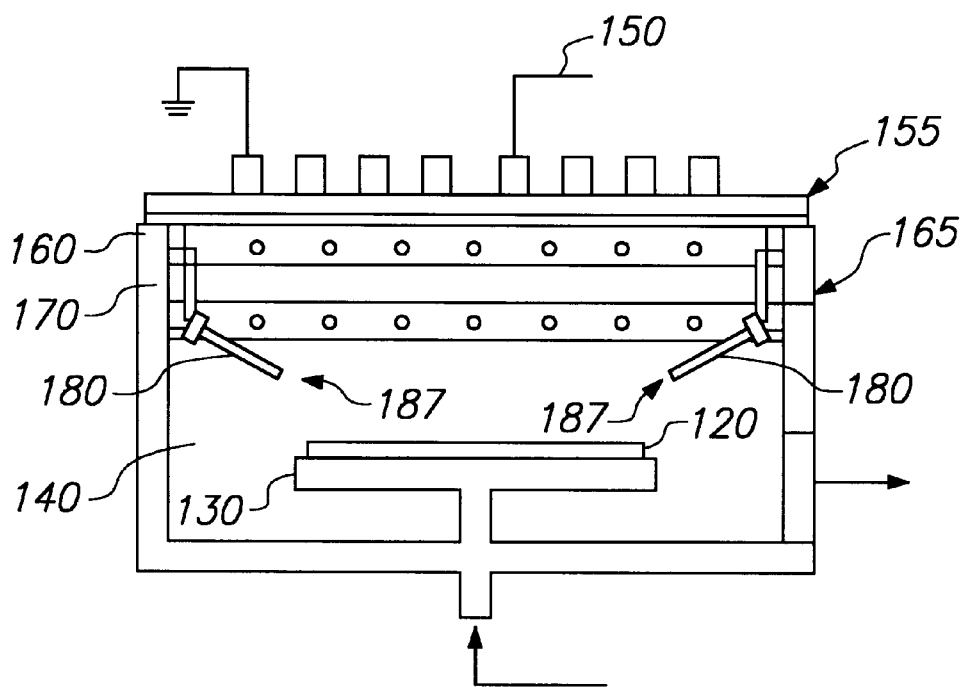
FIG. 4 illustrates a plasma reactor with a gas injection system.

FIG. 4 illustrates a plasma processing system comprising such a gas distribution system. The system includes a substrate support 130 and processing chamber 140. The support may comprise, for example, an RF biased electrode. The support may be supported from a lower endwall of the chamber or may be cantilevered, extending from a sidewall of the chamber. The substrate 120 may be clamped to the electrode either mechanically or electrostatically.

The system further includes an antenna 150, such as the planar multiturn coil shown in FIG. 4, a non-planar multi-turn coil, or an antenna having another shape, powered by a suitable RF source and suitable RF impedance matching circuitry inductively couples RF energy into the chamber to provide a high density plasma. The chamber may include a suitable vacuum pumping apparatus for maintaining the interior of the chamber at a desired pressure. A dielectric window, such as the planar dielectric window 155 of uniform thickness shown in FIG. 4, or a non-planar dielectric window, is provided between the antenna 150 and the interior of the processing chamber 140 and forms the vacuum wall at the top of the processing chamber.

A primary gas ring 170 is provided below the dielectric window 155. The gas ring 170 may be mechanically attached to the chamber housing above the substrate. The gas ring 170 may be made of, for example, aluminum or anodized aluminum.

A secondary gas ring 160 may also be provided below the dielectric window 155. One or more gases such as Ar and $O_2$ are delivered into the chamber 140 through outlets in the secondary gas ring 160. Any suitable gas ring may be used as the secondary gas ring 160. The secondary gas ring 160 may be located above the gas ring 170, separated by an optional spacer 165 formed of aluminum or anodized aluminum, as shown in FIG. 4.

Alternatively, although not shown, the secondary gas ring 160 may be located below the gas ring 170, in between the gas ring 170 and the substrate 120, or the secondary gas ring 160 may be located below the substrate 120 and oriented to inject gas vertically from the chamber floor. Yet another alternative is that the Ar and $O_2$ may be supplied through outlets connected to the chamber floor, with the spacer 165 separating the dielectric window 155 and the primary gas ring 170.

A plurality of detachable injectors 180 are connected to the primary gas ring 170 to direct a process gas such as $SiH_4$ or a related silicon-containing gas such as $SiF_4$, TEOS, and so on, onto the substrate 120. These gases are delivered to the substrate from the injectors 180 through injector exit orifices 187. Additionally, reactant gases may be delivered through outlets in the primary gas ring 170. The injectors may be made of any suitable material such as aluminum, anodized aluminum, quartz or ceramics such as $Al_2O_3$. Although two injectors are shown, any number of injectors may be used. For example, an injector may be connected to each of the outlets on the primary gas ring 170. Preferably, eight to thirty-two injectors are employed on a 200 to 210 mm diameter ring 170 for a 200 mm substrate.

The injectors 180 are located above the plane of the substrate 120, with their orifices at any suitable distance such as, for example, 3 to 10 cm from the substrate. The injectors may, according to a preferred embodiment, be spaced inside or outside of the substrate periphery, for example, 0 to 5 cm from the substrate periphery. This helps to ensure that any potential particle flakes from the injectors will not fall onto the substrate and contaminate it. The injectors may all be the same length or alternatively a combination of different lengths can be used to enhance the deposition rate and uniformity. The injectors are preferably oriented such that at least some of the injectors direct the process gas in a direction which intersects the exposed surface of the substrate.

As opposed to previous gas injection systems designs which rely predominantly on diffusion to distribute gas above the substrate, the injectors according to one embodiment of the present invention are oriented to inject gas in a direction which intersects an exposed surface of the substrate at an acute angle. The angle of injection may range from about 15 to <90 degrees, preferably 15 to 45 degrees from the horizontal plane of the substrate. The angle or axis of injection may be along the axis of the injector or, alternatively, at an angle of up to 90 degrees or more with respect to the axis of the injector. The exit orifice diameter of the injectors may be between 0.010 and 0.060 inches, preferably about 0.020 to 0.040 inches. The hollow core of the injectors 180 may be drilled to about twice the diameter of the exit orifices 187 to ensure that sonic flow occurs at the exit orifice and not within the core of the injector. The flow rate of $SiH_4$ is preferably between 25–300 sccm for a 200 mm substrate but could be higher for larger substrates.

Figure 5:
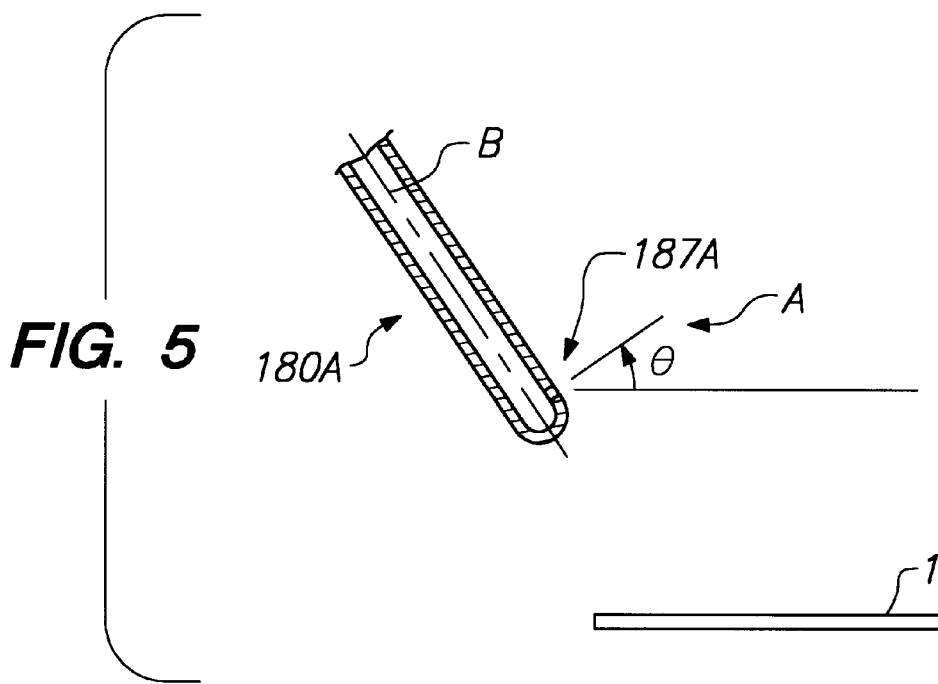
FIG. 5 illustrates an injector for the gas injection system.

Another gas injection system that can be used employs a plurality of injectors as illustrated in FIG. 5. In this embodiment, the orifice 187A is oriented to introduce the gas along an axis of injection (designated "A") in a direction pointing away from the wafer 120A (and toward the dielectric window). The angle or axis of injection may be along the axis of the injector (designated "B") or, alternatively, at an angle of up to about 90 degrees or higher with respect to the axis of the injector. In this configuration, the axis of injection may range from about 5 to <90 degrees, preferably about 15 to 75 degrees, and most preferably, about 15 to 45 degrees from the plane of the substrate. This design retains the feature that the process gas is focused above the wafer which leads to high deposition rates and good uniformity, and further provides the advantage of reduced susceptibility to orifice clogging. The reduced potential of the orifice clogging thus allows more wafers to be processed before injector cleaning is required, which ultimately improves the wafer processing throughput.

Due to the small orifice size and number of injectors and large flowrates of $SiH_4$, a large pressure differential develops between the gas ring 170 and the chamber interior. For example, with the gas ring at a pressure of >1 Torr, and the chamber interior at a pressure of about 10 mTorr, the pressure differential is about 100:1. This results in choked, sonic flow at the outlets of the injectors. The interior orifice of the injector may also be contoured to provide supersonic flow at the outlet.

Injecting the $SiH_4$ at sonic velocity inhibits the plasma from penetrating the injectors. This design prevents plasma-induced decomposition of the $SiH_4$ and the subsequent formation of amorphous silicon residues within the gas ring and injector extension tubes.

EXPERIMENTAL

For gap filling and depositing a cap layer, the process generally comprises an initial optional sputter clean/pre-heat step in a plasma without any silicon-containing gas which is followed by a high bias power gap-fill step. After the gap has been partially filled, a final sacrificial or "cap" layer of film is deposited preferably at low RF bias power. Preferably, the gap-fill step fills substantially all or at least a major portion of the gap before the cap layer is deposited. The cap layer deposition step only requires enough bias power to keep the film quality adequate as no sputtering during film growth is required. The cap layer is deposited at a higher deposition rate than that of the gap-fill step. Preferably, this cap film is partially removed in a subsequent chemical-mechanical polishing (CMP) planarization step.

The IC PECVD system generates a high density, low pressure plasma in a process gas comprising components that form the semiconducting or dielectric, and cap films. The inventive process is applicable to depositing any suitable semiconducting, dielectric and/or cap film including, for example, hydrogenated amorphous silicon Si:H, silicon oxide $SiO_x$, where x is 1.5 to 2.5, silicon nitride, SiN, silicon oxyfluoride, $SiO_xF_y$ where x is 1.5 to 2.5 and y is 2 to 12, and mixtures thereof. It is understood that both stoichiometric and non-stoichiometric compounds can be deposited and the values of x and y can be controlled by regulating the process parameters such as, for example, the choice of reactant gases and their relative flow rates. It is expected that inorganic and organic polymers can also be deposited. A preferred dielectric and cap film comprises $SiO_2$. While the invention will be illustrated by describing the deposition of $SiO_2$, it is understood that the invention is applicable to other films.

The components of the process gas will depend on the semiconducting and/or dielectric film to be deposited. With respect to silicon-containing films the process gas can comprise, for example, silane ($SiH_4$), tetraethylorthosilicate (TEOS), 1,3,5,7-tetramethylcyclotetrasiloxane (TMCTS), disilane ($Si_2H_6$) or other silicon-containing organometallic gases. The process gas may include a noble gas preferably Ar, Kr, Xe, and mixtures thereof to control plasma properties or sputtering rates particularly during the gap filling step prior to depositing the cap layer. To incorporate non-silicon components into the film, the process gas may include a reactant gas such as, for example, $H_2$, $O_2$, $N_2$, $NH_3$, $NF_3$, $N_2O$, NO and mixtures thereof. Reactant gases may also comprise boron and/or phosphorous containing gases to produce boro-phospho-silicate glass (BPSG), boro-silicate glass (BSG), and phospho-silicate gas (PSG) films.

EXAMPLE I (Gap-filling process)

$SiO_2$ IMD depositions were conducted in an ICP system similar to that of FIG. 1. Mechanically-clamped 150 mm wafers were employed. Two gas rings located at the bottom edge of window 33 were employed. One ring distributed the $SiH_4$ and the other distributed the Ar and $O_2$. System parameters are set forth in Table 1. The electrode temperature was maintained at 80° C.

TABLE 1

| | |
|---|---|
| ICP RF power | 1000 watts at 13.56 MHz |
| Electrode bias RF power | 1000 watts at 400 kHz |
| Ar mass flow rate | 100 sccm |
| $O_2$ mass flow rate | 60 sccm |
| $SiH_4$ mass flow rate | 40 sccm |
| Wafer backside He pressure | 3 Torr |
| Chamber pressure | 3.75 milli-Torr (1000 l/s pump) |

Effect of Oxygen to Silane Mass Flow Ratio (at constant total flow) on Film Properties The film stoichiometry was determined by the chemical composition of the plasma, established primarily by the ratio R of the silane and oxygen mass flow rates: $R = Q_{SiH4}/(Q_{SiH4} + Q_{O2})$ where Q is the gas mass flow rate. Note that the effective oxygen-silane ratio that the wafer sees also depended on other process parameters. The effect of R on the film properties is shown in Table 2.

TABLE 2

| $O_2$ Flow Rate | $SiH_4$ Flow Rate | Ratio % | Time | Dep. Rate | Stress | Film Refractive Index* | | | OH Content |
|---|---|---|---|---|---|---|---|---|---|
| sccm | sccm | % | sec | Å/min. | MPa | center | mid-radius | edge | at. % |
| 60 | 40 | 0.40 | 180 | 3460 | −91 | 1.4630 | 1.4628 | 1.4633 | 2.72 |
| 70 | 30 | 0.30 | 280 | 2585 | −74 | 1.4574 | 1.4579 | 1.4579 | 9.10 |
| 55 | 45 | 0.45 | 132 | 3969 | −116 | 1.5414 | 1.5376 | 1.5628 | 0.43 |
| 80 | 20 | 0.20 | | | | | | | 9.43 |
| 50 | 50 | 0.50 | 120 | 5449 | −66 | | | | 0.31 |
| 50 | 50 | 0.50 | 104 | 5527 | −66 | 1.6269 | 1.6203 | | 0.28 |
| 65 | 35 | 0.35 | 101 | 3284 | −90 | | | | 8.79 |
| 70 | 30 | 0.30 | 280 | 2613 | −65 | 1.4574 | 1.4572 | 1.4572 | 9.45 |
| 60 | 40 | 0.40 | 180 | 3591 | −106 | 1.4638 | 1.4635 | 1.4647 | 2.20 |
| 80 | 20 | 0.20 | 480 | 1513 | −63 | 1.4572 | 1.4571 | 1.4572 | 9.08 |
| 65 | 35 | 0.35 | 223 | 3317 | −87 | 1.4584 | 1.4578 | 1.4586 | 8.85 |
| 100 | 0 | 0.00 | 300 | 0 | | | | | |

*The refractive index was measured at the center, mid-radius and edge of each wafer.

The plasma chemistry for the deposition can be broadly classified into the following reactions:

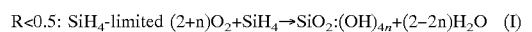

Here, $SiO_2:(X)_n$ indicates an approximately stoichiometric oxide containing some fraction n of X, where $0 \leq n < 1$. Based on the OH contents measured, n was always less than 0.025 (OH <10 at. %). Reaction (I) dominated as long as film growth was silane-limited ($R \leq 0.5$). This reaction released increasing amounts of water into the plasma as R decreased, which accounts for the observation that the OH concentration in the films increased with decreasing R. Conversely, operating in the oxygen-limited regime, reaction (II) (R>0.5) resulted in increased $H_2$ production, which accounts for the increasing incorporation of H as Si—H (and the resulting appearance of Si-rich, sub-oxide groups such as $Si_2O_3$) at larger R. This also accounts for the higher chamber pressures measured at high R, since turbomolecular pumps have low pumping speeds in $H_2$.

The data also suggest that a significant change in the process takes place near R=0.40. This transition was evident in all film properties, as shown in Table 2, and appears to correspond to the transition from a silane-limited chemistry, reaction (I), to an oxygen-limited chemistry, reaction (II), discussed above. The deposition rate depended linearly on silane flow, and the silane-limited region (R<0.40) extrapolated to zero thickness at zero flow, as would be expected.

Film stress is typically a function of the mechanical stress due to differential thermal expansion between the film and substrate, and the intrinsic film stress. The former is primarily determined by the deposition temperature. In the latter case, the film micro-structure and stoichiometry were the dominant factors. In the $SiH_4$-limited regime, the film stress appeared to depend primarily on the deposition rate. It is believed that faster film growth allowed less time thermal relaxation and sputtering/densification by ion bombardment. Films grown under $O_2$-limited conditions were less compressive, even though deposited at higher deposition rates, than films grown under $O_2$-rich conditions.

Figure 2:
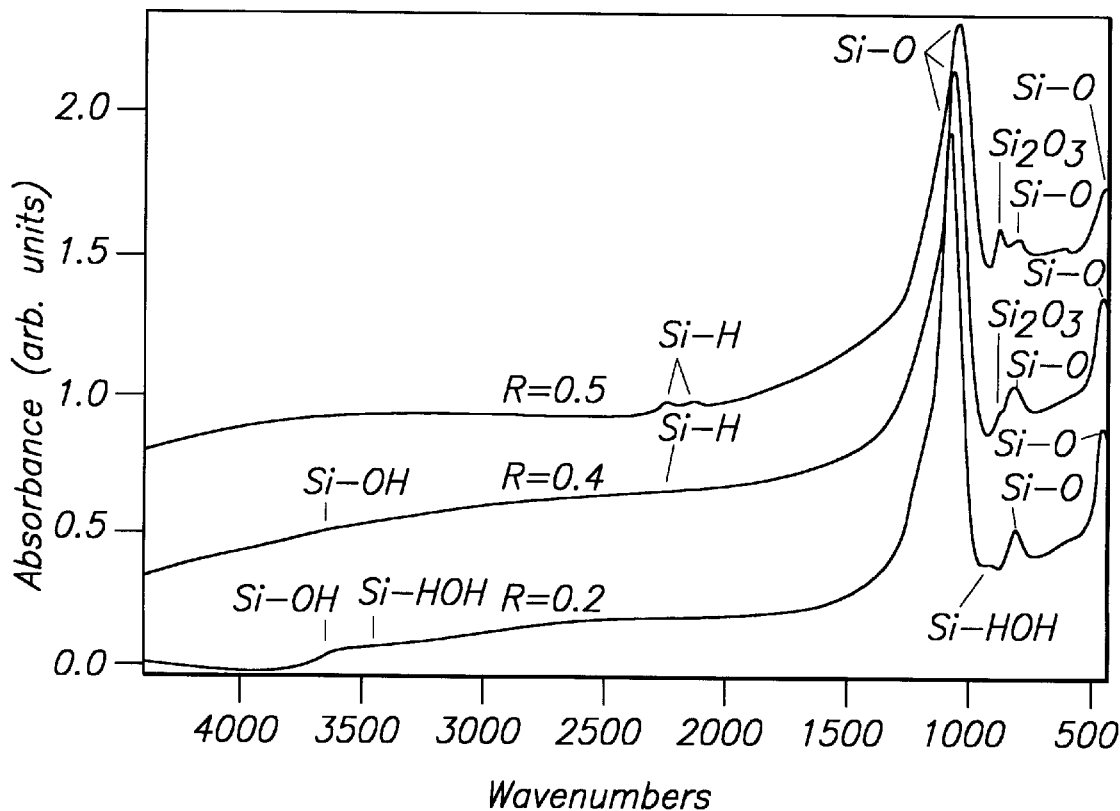
FIG. 2 comprises FTIR spectra of films deposited at various oxygen to silane mass flow ratios (constant total flow).

The FTIR spectra, shown in FIG. 2, illustrate the relevance of reactions I and II. At low R, Si—OH and Si—HOH absorbance bands were observed, but not for Si—H. At high R, there was no detectable Si—OH, but both Si—H and sub-oxide ($Si_2O_3$) Si—O bands were present. At intermediate R, just on the $O_2$-rich side of the critical range, there appears to be minimal Si—OH and Si—H incorporation. The intermediate R range is optimum for achieving the desired dielectric constant. The refractive index can also be used as a gauge for the preferred operating conditions since refractive indices between 1.465 and 1.480 correspond to films having good dielectric constants.

Effect of ICP Power On Film Properties:

Table 3 shows how the film properties depend on the ICP power with the bias power held constant at 1000 W.

TABLE 3

| ICP Power | Dep. Rate | Stress | $SiO_x$ Refractive Index | | | OH Content |
|---|---|---|---|---|---|---|
| W | Å/min. | MPa | center | mid-radius | edge | at. % |
| 1200 | 3295 | −196 | 1.4659 | 1.4664 | 1.4659 | 3.81 |
| 800 | 3103 | −138 | 1.4731 | 1.4738 | 1.4743 | 0.65 |
| 600 | 3117 | −128 | 1.4731 | 1.4879 | 1.4866 | 0.43 |
| 400 | 3008 | −139 | 1.5178 | 1.5151 | 1.5139 | 0.53 |
| 200 | 2731 | −123 | 1.5610 | 1.5606 | 1.5675 | 0.51 |
| 1200 | 3396 | −208 | 1.4693 | 1.4691 | 1.4640 | 3.95 |
| 200 | 2674 | −113 | 1.5510 | 1.5507 | 1.5515 | 0.60 |
| 600 | 3060 | −142 | 1.4796 | 1.4772 | 1.4746 | 0.55 |

The effect that ICP power has on film properties is similar in nature to that caused by the total flow. Both effects appear to essentially be a deposition precursor supply phenomenon. Assuming that the primary deposition precursor was generated through silane dissociation, the supply of this species on the wafer surface will depend on its rate of generation in the plasma and its rate of loss to the pump and to deposition on the reactor walls. Both the total flow and the ICP power could influence the effective R at the wafer through either generation or loss based mechanisms.

In the case of precursor generation, calculations based on bond strengths show that the energy required to dissociate $SiH_4$ should be less than that for $O_2$. In this case, increasing the silane supply (total flow) would preferentially increase the supply of $SiH_x$ over any relevant oxygen species. This drives the reaction chemistry to higher R, as observed. The ICP power should also drive this process, although it is unclear what the dependence should be.

Effect of Bias Power on Film Properties

The bias power was applied to the wafer in order to increase the DC sheath potential, and thus the kinetic energy of the bombarding ions, to the point where they sputter the film as it grows. This improved the quality of the films in a variety of ways. $O_2$ plasma preceding deposition sputter cleans the wafer surface, allowing a clean, adherent interface to form. Since ion bombardment heats the wafer during deposition, temperature control requires He backside cooling. Ion bombardment also tends to preferentially sputter "etch" weak and nonequilibrium structures from the film, and to produce densification through compaction. This allows high quality films to be deposited at lower wafer temperatures than otherwise possible. The dependence of the film properties on bias power is shown in Table 4.

TABLE 4

| RF Bias Power | Dep. Rate | Stress | Refractive Index | | | OH Content |
|---|---|---|---|---|---|---|
| Watts | Å/min. | MPa | center | mid-radius | edge | at. % |
| 1 | 3850 | −295 | 1.4756 | 1.4751 | 1.4763 | 2.28 |
| 1 | 3853 | −301 | 1.4750 | 1.4749 | 1.4758 | 2.30 |
| 1 | 3842 | −315 | 1.4756 | | | 2.56 |
| 100 | 3858 | −334 | | 1.4759 | | 2.64 |
| 100 | 3883 | −368 | | 1.4761 | | 2.57 |
| 100 | 3893 | −361 | 1.4767 | | | 4.05 |
| 200 | 3823 | −348 | | 1.4763 | | 3.38 |
| 400 | 3835 | −317 | | 1.4744 | | 4.73 |
| 500 | 3722 | −117 | 1.4653 | | | 4.90 |
| 600 | 3652 | −104 | | 1.4644 | | 3.77 |
| 800 | 3613 | −93 | | 1.4639 | | 2.88 |
| 1000 | 3345 | −96 | 1.4633 | 1.4627 | 1.4639 | 2.40 |
| 1000 | 3505 | −108 | 1.4628 | 1.4622 | 1.4635 | 2.31 |
| 1000 | 3350 | −96 | 1.4623 | | | 2.69 |
| 1000 | 3538 | −105 | 1.4633 | | | 2.25 |
| 1200 | 3393 | −107 | 1.4636 | | | 2.06 |
| 1400 | 3336 | −123 | 1.4645 | | | 1.34 |
| 1600 | 3159 | −101 | 1.4633 | | | 1.79 |

It was observed that general film properties underwent a significant change between 400 and 500 watts. It is believed that although the ion energy may have increased with bias power below 400 W, the ions did not have sufficient energy to sputter, so the dominant effect of bias power in this regime was to enhance plasma generation above the wafer. Above 400 W, the average ion energy was presumably above the sputtering threshold for $SiO_2$, and the net deposition rate decreased as the sputtering component dominated any effects due to secondary plasma generation.

Gap-Fill Deposition

Gap-fill performance can be predicted from the "etch to deposition rate ratio", ER/DR, which is calculated from the deposition rates with and without RF bias (the "zero-bias" condition actually used 100 W to account for secondary plasma generation): E/D=[DR(no bias)−DR(bias)]÷DR(no bias), (where DR denotes the deposition rate. Processes with higher E/D can fill more aggressive gaps. Generally, the lowest possible E/D that will fill the required gaps should be used in order to maximize the net deposition rate. Of course, once the gaps are filled, the E/D should be reduced to the minimum value needed to preserve film quality, thus allowing the majority of the IMD layer to be deposited at much higher rates.

Figure 3A:
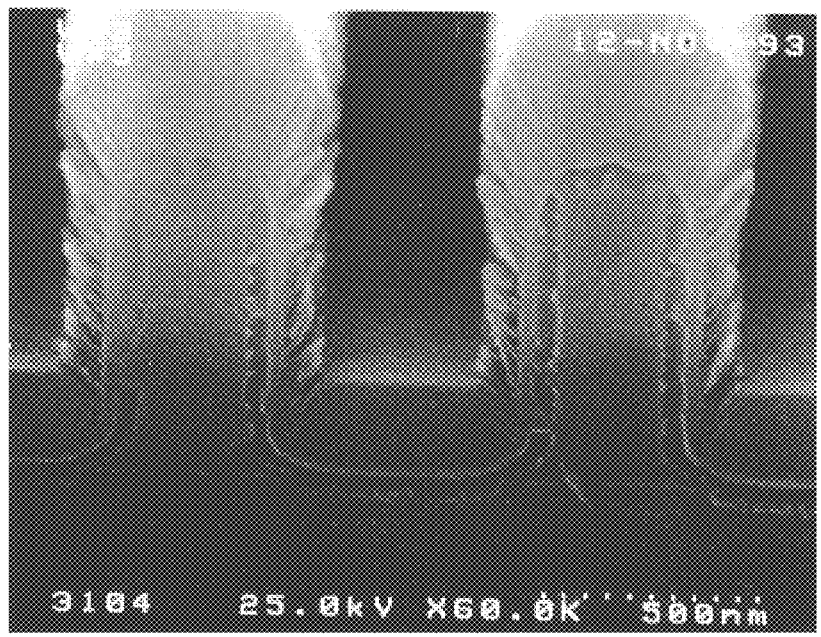
FIGS. 3A, 3B, 3C, and 3D are scanning electron microscopy (SEM) images of gap fills wherein all samples were decorated to enhance imperfections in the film; the structures were polysilicon on oxide and all depositions were for 3 minutes, except that of 3A, which was for 1 minute.
Figure 3B:
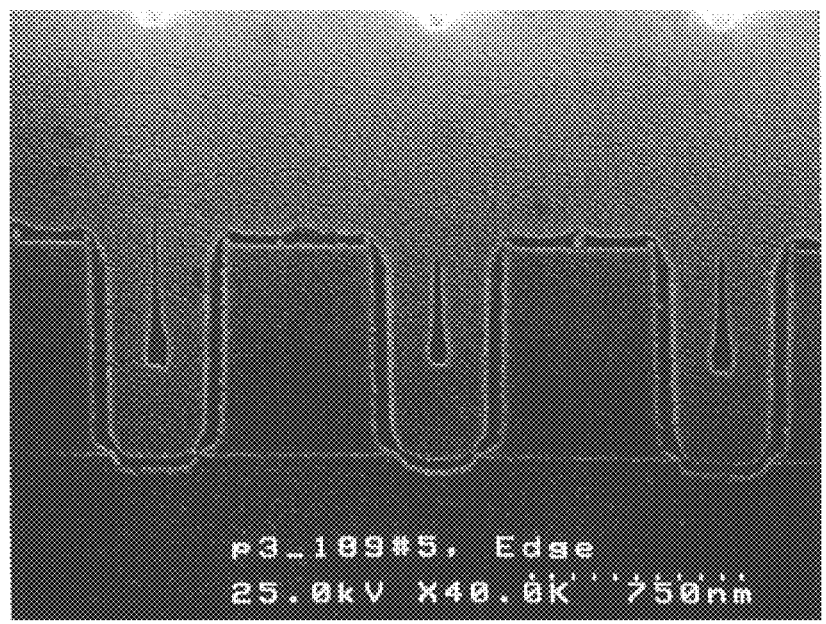
Figure 3C:
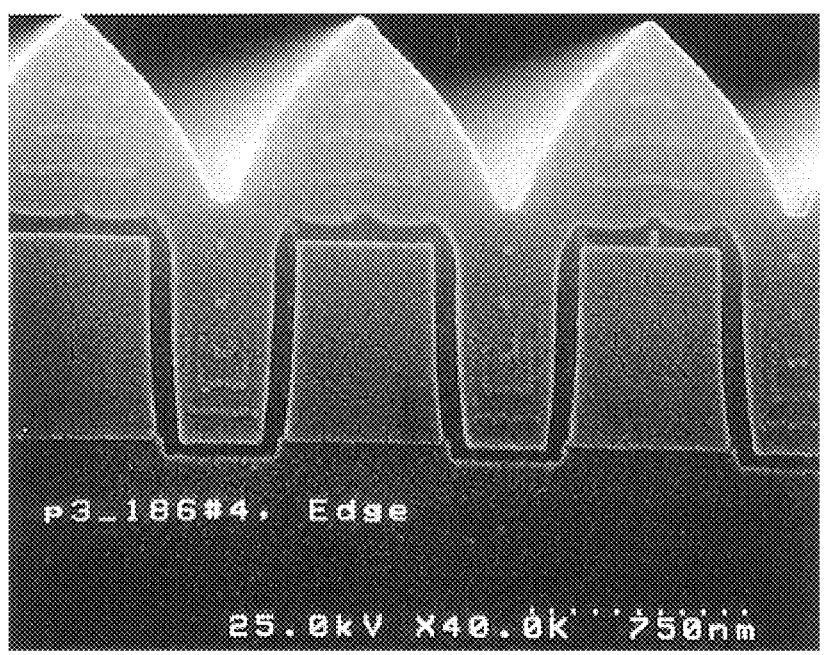
Figure 3D:

The SEMs shown in FIGS. 3A, 3B, 3C, and 3D show examples of good and bad gap-fill by ICP-CVD. FIG. 3A shows a partial fill attempted with no bias power. The porous film morphology and the "breadloaf" appearance of the film can be seen at the top of the line. This eventually closes over to leave a void like that shown in FIG. 3B. These are also the structures that are preferentially sputtered away, since the sputtering yield is a maximum at 45°. FIG. 3B gives an example of unsuccessful fill where bias power was used, but the E/D was too low for the gap. Note that the breadloaves closed early in the process, leaving a large, deep gap. In FIG. 3C a tiny void formed just before the gap filled can be seen next to an otherwise identical gap that filled successfully. In this case E/D was marginal. The layering was done deliberately by depositing a thin Si-rich layer periodically and decorating the sample with the appropriate stain to bring out the composition contrast. This clearly shows how the gap fills from the bottom up, with little sidewall growth compared to that on horizontal surfaces. The 45° facets formed above the lines by sputtering are also clearly visible. FIG. 3D shows how a moderate E/D process (100 sccm Ar) completely filled an aggressive gap. This shows that ICP-CVD can fill aggressive structures.

EXAMPLE II
(GaM-fill and Capping Processes)

$SiO_2$ IMD and capping depositions were conducted in an ICP system similar to that of FIG. 4. In this example 200 mm wafers were processed. The wafers were electrostatically clamped to a thermally controlled chuck. The lower electrode was powered by a 13.56 MHz generator. A 2000 l/sec pump to improve the pumping speed at high flows was also implemented into the ICP/CVD system. ICP power ranging from 1000 to 2500 watts was used. High bias power was used for the gap fill process and ranged from 500 to 2500 watts.

Typical process parameters are shown in Table 5 for the gapfill, cap, and sacrificial cap layers and the corresponding film characteristics. The table also lists the preferred ranges for the process parameters.

In the prior art, increasing the source and bias power have been used to increase the substrate temperature in an attempt to improve film quality. However, this often leads to a tradeoff amoung the desired film properties as demonstrated by the results below which examine the effect of helium backside pressure, power and chamber height.

Effect of Helium Backside Pressure Power and Chamber Height

A series of depositions were conducted wherein spacer height, helium cooling pressure and power level of the ICP-CVD device were varied to modulate the substrate temperature with an 80° C. electrode temperature. Table 6 presents the results. Substrate temperatures near 400° C. were found to produce high quality oxides. Among other things, a high substrate temperature drives off volatile species and improves film density. For deposition 3 where no helium was used, it was estimated that the wafer temperature was over 450° C.

In the first three-wafer set, the helium pressure was reduced from 2 Torr to 0 Torr (i.e. no cooling) and this caused an increase in the substrate temperature range from 275° C. to over 400° C. The film characteristics indicated that high wafer temperatures produced high quality film. Low OH levels were found in the films and all of the other film properties were excellent. The advantage of using high wafer temperature is that it does not cause adverse effects with respect to the film stress, OH % and wet etch ratio.

TABLE 5

|  | Gap-Fill | Cap-layer | Sacrificial Cap-Layer |
| --- | --- | --- | --- |
| Process Parameter |  |  |  |
| Pressure (mT)* | 5 (1–5) | 14 (5–30) | 12 (5–30) |
| ICP Power (watts) | 2500 (1000–3500) | 2500 (1000–3500) | 2500 (1000–3500) |
| Bias Power (watts) | 2000 (1000–3000) | 2000 (1000–3000) | 0 (0–3000) |
| Ar (sccm) | 50 (0–100) | 0 (0–100) | 100 (0–200) |
| $O_2$ (sccm) | 80 (25–150) | 350 (150–500) | 300 (150–300) |
| $SiH_4$ (sccm) | 60 (20–200) | 250 (80–400) | 200 (80–400) |
| Electrode temp. (° C.) | 120 (60–200) | 120 (60–200) | 120 (60–200) |
| Backside He Pressure (Torr) | 1 (~0–6) | 1 (~0–6) | 1 (~0–6) |
| *Preferred ranges are provided in (parenthesis) |  |  |  |
| Film Characteristics |  |  |  |
| Deposition Rate (Å/min) | 3080 | 11300 | 10700 |
| Uniformity (% 1 sigma) | 3.7% | 3.8% | 2.5% |
| Film Index | 1.47 | 1.47 | 1.47 |
| Uniformity of Index (% 1 sigma) | <1% | <1% | <1% |
| Stress (MPa) | −170 | −172 | −111 |
| % OH | <2% | <1% | <1% |
| Wet Etch Rate $SiO_x$ = 1.0 | <2:1 | <2:1 | 3.5:1 |

In these depositions (0.5 μm gaps), argon was included in the process gas. However, the addition of argon is not always necessary as indicated in the preferred ranges. In the deposition of the cap layer, the initial deposition can employ a high electrode RF bias power to produce a good quality film. Thereafter, a lower bias power can be applied (preferably while maintaining about the same electrode temperature) to produce a sacrificial cap layer of lesser quality. Typically this sacrificial cap layer is substantially removed in a subsequent planarization process.

Generally a higher substrate temperature improves deposited film properties. Typically, there are two primary contributors to the substrate temperature: (1) thermal heating from the substrate support (ESC) and (2) plasma heating which comes primarily from the electrode RF bias power and, to a lesser extent, from the source (ICP, ECR, etc) power.

The second set of wafers (deposition no. 4, 5 and 6) demonstrate the effects of using helium and argon cooling gas for substrate temperature control. The first 3-wafer set used helium, and the second set of three wafers used argon for cooling. The results show that helium and argon produced similar process results.

The first and third set of 3-wafers compare the effect of plasma heating of the wafer. The wafer heating was accomplished by decreasing the distance between the ICP coil to the substrate surface (spacer height). The results indicated that film quality changed going from high to lower gap spacing for the same power level process. The OH% remained the same and the wet etch ratio improved at lower spacing comparing the 2 or 1 Torr helium cooling case. However, more compressive stress was observed when lower gap spacing was used.

When comparing the third 3-wafer set to the last 2 wafers in Table 6, the ICP power was decreased from 2500 to 2000 watts. The data show that less compressive stress was observed by decreasing the power. The wet etch ratio was degraded indicating that less plasma heating changed the film structure possibly making the film more porous. Therefore, the wet etch ratio is better at higher power levels.

TABLE 6

| Process conditions | Dep. rate Å/min | Uniformity (% 1-Sigma) | Film Ref. Index | Stress (MPa) | OH content (at %) | Wet etch ratio |
|---|---|---|---|---|---|---|
| 1  6/2/2500 | 9371 | 3.63% | 1.477 | −246 | 1.7% | 7.38 |
| 2  6/1/2500 | 9317 | 3.60% | 1.480 | −195 | 1.3% | 6.67 |
| 3  6/0/2500 | 8129 | 2.83% | 1.482 | −65  | 0.3% | 1.83 |
| 4  6/2/2500 | 9419 | 3.68% | 1.478 | −242 | 0.46% | 8.02 |
| 5  6/1/2500 | 9420 | 3.65% | 1.475 | −175 | 0.88% | 7.64 |
| 6  6/1/2500 | 9452 | 3.53% | 1.472 | −219 | 1.37% | 7.98 |
| 7  0/2/2500 | 9146 | 6.47% | 1.479 | −377 | 1.0% | 3.67 |
| 8  0/1/2500 | 9111 | 6.35% | 1.478 | −349 | 2.5% | 3.22 |
| 9  0/3/2500 | 9159 | 6.60% | 1.477 | −370 | 0.4% | 3.40 |
| 10 0/2/2000 | 8884 | 4.53% | 1.479 | −227 | 1.1% | 5.29 |
| 11 0/1/2000 | 8870 | 4.86% | 1.478 | −168 | 0.1% | 4.97 |

*The process conditions were spacer height (cm), helium cooling pressure (Torr), and (3) ICP power (watts). The RF bias was zero for each case.

Effect of Heated Electrode on Film Properties

In contrast to the approach of using the source and bias powers to increase the substrate temperature, it was demonstrated that using a higher electrode temperature can lead to improved film quality and a wider process window, without a tradeoff among the desired values of film stress, OH% and/or wet etch ratio.

This is illustrated by the results shown in Table 7, where cap layer deposition results with a 70 and 120° C. electrode are summarized for cases with and without an applied RF bias. Preferably, in preparing a cap layer film the wet etch ratio is <2:1, the OH% is ≦about 1%, and the magnitude of film stress is less than 200 Mpa. Simply increasing the plasma heating of the wafer by increasing the bias from 0 to 2000 W leads to a decrease in the wet etch ratio, but this also leads to an undesirable increase in film stress. In contrast, by using a higher temperature electrode, both the film stress and wet etch ratio are reduced for cases with and without RF bias power. Hence, a preferred process uses a thermally controlled electrode with a temperature that is selectable from the range of about 60 to 200° C.

TABLE 7

Comparison of film properties with 70 and 120° C. electrodes

|  | Wafer Temp (° C.) | | Stress (MPa) | | % OH | | Wet Etch Rate Ratio | |
|---|---|---|---|---|---|---|---|---|
|  | 70° ESC | 120° ESC | 70° ESC | 120° ESC | 70° ESC | 120° ESC | 70° ESC | 120° ESC |
| Cap Layer with bias | 340 | 375 | −250 | −190 | 1.8 | 0.7 | 1.5 | 1.3 |
| Cap Layer w/out bias | 140 | 170 | −193 | −128 | 1.9 | 1.4 | 3.8 | 2.7 |

Process parameters used are set forth is Table 5

Another benefit of employing a higher electrode temperature is that the ranges for the other process conditions including, for example, pressure, reactant gas flow rates, and TCP power are wider so that a broader set of operating conditions can be employed.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of filling gaps between electrically conductive lines on a semiconductor substrate comprising the steps of:

providing a substrate in a process chamber of an inductively coupled plasma-enhanced chemical vapor deposition (PECVD) reactor that comprises a substantially planar induction coil that generates a plasma;

introducing a process gas comprising a noble gas into the process chamber wherein the amount of noble gas is sufficient to assist in gap filling;

applying a radio frequency bias to the substrate; and growing a dielectric film by PECVD on the substrate, wherein the dielectric film fills substantially the gaps between electrically conductive lines on the substrate and wherein the gaps have a diameter of less than 0.5 µm.

2. The method of claim 1, wherein the process gas further comprises a silicon-containing reactant gas selected from the group consisting of $SiH_4$, $SiF_4$, $Si_2H_6$, TEOS, TMCTS, and mixtures thereof, said process further comprising decomposing the silicon-containing reactant to form a silicon containing gas and plasma phase reacting said silicon-containing gas on a surface of the substrate.

3. The method of claim 2, wherein the process gas comprises a reactant gas selected from the group consisting of $H_2$, $O_2$, $N_2$, $NH_3$, $NF_3$, $N_2O$, and NO, and mixtures thereof.

4. The method of claim 2, wherein the process gas comprises a reactant gas selected from the group consisting of boron-containing gas, phosphorous-containing gas, and mixtures thereof.

5. The method of claim 3, wherein the process gas comprises a reactant gas selected from the group consisting of boron-containing gas, phosphorous-containing gas, and mixtures thereof.

6. The method of claim 1, wherein the vacuum is maintained at about 1 mTorr to about 30 mTorr.

7. The method of claim 1, wherein the film is deposited on a silicon wafer and the gaps are between conductor lines comprising aluminum, copper, tungsten, and mixtures thereof.

8. The method of claim 1, wherein the step of applying a radio frequency bias to the substrate comprises supporting the substrate on a substrate holder having an electrode supplying a radio frequency bias to the substrate, the radio frequency bias being generated by supplying the electrode with at least 2 watts/$cm^2$ of power.

9. The method of claim 1, wherein the radio frequency bias applied to the a substrate is at a frequency of between about 100 kHz to 27 MHz.

10. The method of claim 1, wherein the substrate is positioned on a substrate holder that is maintained at a temperature of about 80° C. to 200° C.

11. The method of claim 1, further comprising supplying a heat transfer gas between a surface of the substrate and a surface of a substrate support on which the substrate is supported during the film growing step.

12. The method of claim 11, further comprising clamping the substrate on an electrostatic or mechanical chuck during the film growing step.

13. The method of claim 12, wherein heat transfer gas which comprises helium and/or argon is supplied to a space between a surface of the substrate and a surface of the chuck.

14. The method of claim 1, further comprising plasma phase reacting an oxygen-containing gas in the gaps and removing polymer residues in the gaps prior to the film growing step.

15. The method of claim 1, wherein the dielectric film comprises silicon oxide.

16. The method of claim 1 wherein the dielectric film comprises $SiO_2$.

17. The method of claim 1, wherein the process gas includes a silicon and fluorine-containing reactants and the dielectric film comprises silicon oxyfluoride.

18. The method of claim 1, wherein the gas mixture includes a nitrogen-containing gas and the dielectric film comprises silicon oxynitride.

19. The method of claim 1, wherein the process gas is introduced through a gas supply including orifices, at least some of the orifices orienting the process gas along an axis of injection which intersects an exposed surface of the substrate at an acute angle.

20. The method of claim 19, wherein the step of introducing a process gas comprises the step of supplying a gas or gas mixture from a primary gas ring, wherein at least some of said gas or gas mixture is directed toward said substrate.

21. The method of claim 20, wherein the step of introducing the gas further comprises the step of supplying an additional gas or gas mixture from a secondary gas ring.

22. The method of claim 20, wherein injectors are connected to said primary gas ring, the injectors injecting at least some of said gas or gas mixture into said chamber and directed toward the substrate.

23. A method of filling gaps between electrically conductive lines on a semiconductor substrate and depositing a capping layer over the filled gaps comprising the steps of:

providing a substrate in a process chamber of an inductively coupled plasma-enhanced chemical vapor deposition (PECVD) reactor that comprises a substantially planar induction coil that generates a plasma;

filling gaps between electrically conductive lines on the substrate by PECVD by introducing a first process gas comprising a noble gas and growing a first dielectric film in the gaps at a first deposition rate; and after filling a major portion or substantially all of the each gap with the first dielectric film, depositing by PECVD a capping layer comprising a second dielectric film onto the surface of said first dielectric film by introducing a second process gas comprising a noble gas into the process chamber, said layer being deposited at a second deposition rate that is higher than the first deposition rate wherein the gaps have a diameter of less than 0.5 µm.

24. The method of claim 23, wherein the dielectric film comprises silicon oxide, the first and second process gases including a silicon reactant and an oxygen reactant, the second process gas containing higher amounts of the silicon and oxygen reactants than the first process gas.

25. The method of claim 23, wherein the dielectric film comprises silicon oxide, and the first process gas includes a higher amount of the noble gas than the second process gas.

26. The method of claim 23, wherein the RF bias being higher during the gap filling step than during the capping step.

27. The method of claim 23, wherein the substrate is positioned on a substrate holder that is maintained at a temperature of about 80° C. to 200° C.

28. The method of claim 23, wherein the process gas is introduced through a gas supply including orifices, at least some of the orifices orienting the process gas along an axis of injection which intersects an exposed surface of the substrate at an acute angle.

29. A method of depositing a dielectric film substrate comprising the steps of:

providing a substrate in a process chamber of an inductively coupled plasma-enhanced chemical vapor deposition (PECVD) reactor wherein the substrate is positioned on a substrate holder;

introducing a process gas comprising a noble gas into the process chamber wherein the amount of noble gas is sufficient to cause sputter etching;

controlling the temperature on a surface of the substrate holder;

applying a radio frequency bias to the substrate; and energizing the process gas into a plasma state by inductively coupling RF energy into the process chamber and growing a dielectric film on the substrate by PECVD the dielectric film being deposited in gaps between electrically conductive lines on the substrate wherein the gaps have a diameter of less than 0.5 µm and the dielectric film substantially fills the gaps.

30. The method of claim 29, wherein the process gas further comprises a silicon-containing reactant gas selected from the group consisting of $SiH_4$, $Si_2H_6$, $SiF_4$, TEOS, TMCTS, and mixtures thereof, said process further comprising decomposing the silicon-containing reactant to form a silicon containing gas and plasma phase reacting said silicon-containing gas on a surface of the substrate.

31. The method of claim 30, wherein the process gas comprises a reactant gas selected from the group consisting of $H_2$, $O_2$, $N_2$, $NH_3$, $NF_3$, $N_2O$, and NO, and mixtures thereof.

32. The method of claim 30, wherein the process gas comprises a reactant gas selected from the group consisting of boron-containing gas, phosphorous-containing gas, and mixtures thereof.

33. The method of claim 31, wherein the process gas comprises a reactant gas selected from the group consisting of boron-containing gas, phosphorous-containing gas, and mixtures thereof.

34. The method of claim 29, wherein the process chamber is a vacuum maintained at about 1 mTorr to about 30 mTorr.

35. The method of claim 29, wherein the step of applying a radio frequency bias to the substrate comprises supporting the substrate on a substrate holder having an electrode supplying a radio frequency bias to the substrate, the radio frequency bias being generated by supplying the electrode with at least 2 watts/cm$^2$ of power.

36. The method of claim 29, wherein the radio frequency bias applied to the substrate is at a frequency of between about 100 kHz to 27 MHz.

37. The method of claim 29, wherein the substrate is positioned on a substrate holder that is maintained at a temperature of about 80° C. to 200° C.

38. The method of claim 37, further comprising supplying a heat transfer gas between a surface of the substrate and a surface of a substrate holder.

39. The method of claim 38, further comprising clamping the substrate on an electrostatic or mechanical chuck during the film growing step.

40. The method of claim 39, wherein the heat transfer gas which comprises helium and/or argon is supplied to a space between a surface of the substrate and a surface of the chuck.

41. The method of claim 37, wherein the dielectric film comprises silicon oxide.

42. The method of claim 37, wherein the dielectric film comprises $SiO_2$.

43. The method of claim 37, wherein the process gas includes a silicon and fluorine-containing reactants and the dielectric film comprises silicon oxyfluoride.

44. The method of claim 29, wherein the gas mixture includes a nitrogen-containing gas and the dielectric film comprises silicon oxynitride.

45. The method of claim 29, wherein the process gas is introduced through a gas supply including orifices, at least some of the orifices orienting the process gas along an axis of injection which intersects an exposed surface of the substrate at an acute angle.

46. The method of claim 1 wherein the inductively coupled plasma-enhanced chemical vapor deposition reactor comprises:

a plasma processing chamber;

a substrate holder supporting the substrate within said processing chamber wherein the substrate holder is at a temperature of about 80° C. to 200° C.;

an electrically-conductive coil disposed outside said processing chamber;

means for introducing the process gas into said processing chamber; and an RF energy source which inductively couples RF energy into the processing chamber to energize the process gas into a plasma state.

47. The method of claim 1 wherein the gaps have a diameter of 0.25 μm or less.

48. The method of claim 23 wherein the inductively coupled plasma-enhanced chemical vapor deposition reactor comprises:

a plasma processing chamber;

a substrate holder supporting the substrate within said processing chamber wherein the substrate holder is at a temperature of about 80° C. to 200° C.;

an electrically-conductive coil disposed outside said processing chamber;

means for introducing the process gas into said processing chamber; and an RF energy source which inductively couples RF energy into the processing chamber to energize the process gas into a plasma state.

49. The method of claim 23, wherein the gaps have a diameter of 0.25 μm or less.

50. The method of claim 29 wherein the inductively coupled plasma-enhanced chemical vapor deposition reactor comprises:

a plasma processing chamber;

a substrate holder supporting the substrate within said processing chamber wherein the substrate holder is at a temperature of about 80° C. to 200° C.;

an electrically-conductive coil disposed outside said processing chamber;

means for introducing the process gas into said processing chamber; and an RF energy source which inductively couples RF energy into the processing chamber to energize the process gas into a plasma state.

51. The method of claim 29 wherein the gaps have a diameter of 0.25 μm or less.

52. The method of claim 1 wherein the gaps have an aspect ratio of 3:1 or higher.

53. The method of claim 23 wherein the gaps have an aspect ratio of 3:1 or higher.

54. The method of claim 29 wherein the gaps have an aspect ratio of 3:1 or higher.

55. The method of claim 1 wherein the gaps have a diameter that is between less than 0.5 μm to 0.25 μm and have an aspect ratio of 3:1 or higher.

56. The method of claim 23 wherein the gaps have a diameter that is between less than 0.5 μm to 0.25 μm and have an aspect ratio of 3:1 or higher.

57. The method of claim 29 wherein the gaps have a diameter that is between less than 0.5 μm to 0.25 μm and have an aspect ratio of 3:1 or higher.

58. The method of claim 1 wherein the gaps that are filled are void-free.

59. The method of claim 23 wherein the gaps that are filled are void-free.

60. The method of claim 29 wherein the gaps that are filled are void-free.

* * * * *

UNITED STATES PATENT AND TRADEMARK OFFICE
CERTIFICATE OF CORRECTION

PATENT NO. : 6,184,158 B1
DATED : February 6, 2001
INVENTOR(S) : Paul K. Shufflebotham et al.

It is certified that error appears in the above-identified patent and that said Letters Patent is hereby corrected as shown below:

Column 16,
Line 23, delete "diameter" and insert therefor -- width --.

Column 17,
Line 52, delete "diameter" and insert therefor -- width --.

Column 18,
Line 24, delete "diameter" and insert therefor -- width --.

Column 19,
Line 32, delete "diameter" and insert therefor -- width --.

Column 20,
Lines 5, 21, 29, 32 and 35, delete "diameter" and insert therefor -- width --.

Signed and Sealed this

Second Day of August, 2005

JON W. DUDAS
*Director of the United States Patent and Trademark Office*